(12) United States Patent
Dutron et al.

(10) Patent No.: US 6,218,319 B1
(45) Date of Patent: Apr. 17, 2001

(54) METHOD OF FORMING AN ARSENIC SILICON GLASS FILM ONTO A SILICON STRUCTURE

(75) Inventors: Anne-Marie Dutron, Le Coudray Montceaux; Patrick Raffin, Joinville le Pont, both of (FR)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/362,979

(22) Filed: Jul. 28, 1999

(30) Foreign Application Priority Data

Jul. 31, 1998 (EP) .................................................. 98480051

(51) Int. Cl.$^7$ .................................................. H01L 21/31
(52) U.S. Cl. ............................................. 438/784; 427/70
(58) Field of Search .................... 438/783, 788; 427/70

(56) References Cited

U.S. PATENT DOCUMENTS 4,755,486 * 7/1988 Treichel et al. ...................... 437/164

* cited by examiner

Primary Examiner—Olik Chaudhuri
Assistant Examiner—Ginette Peralta
(74) Attorney, Agent, or Firm—Jay H. Anderson

(57) ABSTRACT

The method of the present invention is directed to the formation of an arsenic silicon glass (ASG) film onto a silicon structure and finds a valuable application in the buried plate region formation process in the manufacture of deep trench cell capacitors in EDO and SDRAM memory chips. The starting structure is state-of-the-art and consists of a silicon substrate coated by a patterned SiO2/Si3N4 pad layer which defines deep trenches formed therein by etching. At the beginning of the conventional buried plate region formation, the interior side walls of deep trenches are coated with an arsenic doped silicon glass (ASG) film resulting from the co-pyrolysis of TEOS and TEASAT in a vertical hot dual wall LPCVD reactor as standard. According to the present invention, a flow of O2 is added which makes this co-pyrolysis of TEOS and TEASAT no longer interactive. As a consequence, the improved process is much better controlled than the conventional one. The ASG film is conformally deposited onto the structure with a high degree of thickness and arsenic concentration uniformity within a same wafer and from wafer to wafer of the lot.

12 Claims, 6 Drawing Sheets

METHOD OF FORMING AN ARSENIC SILICON GLASS FILM ONTO A SILICON STRUCTURE

FIELD OF INVENTION

The present invention relates to the manufacture of semiconductor integrated circuits (ICs) and more particularly to an improved method of forming an arsenic silicon glass (ASG) film having an uniform thickness onto a silicon structure. The method finds a very useful application in the conformal deposition of such an ASG film in deep trenches formed in a silicon substrate to provide the necessary doping to create the buried plate region of cell capacitors. Deep trench cell capacitors are extensively employed in EDO (extended data out) and SDRAM (synchronous dynamic random access memory) memory chips. This process improvement significantly reduces chip manufacturing costs.

BACKGROUND OF THE INVENTION

To date, deep trenches are extensively used in the manufacture of integrated circuits (ICs) and in particular in the manufacture of 64 and 256 Mb and will be probably used up to 1 Gb EDO and SDRAM memory chips in the future to define the storage capacitor of each memory cell. Basically, a deep trench is formed in a slightly doped silicon substrate, then a thin dielectric film is conformally deposited thereon to coat the entire interior trench surface and finally, the trench is filled with doped polysilicon. This silicon substrate/dielectric film/doped polysilicon composite structure forms the cell capacitor. To keep an acceptable capacitor value in spite of continuous size reduction, the thickness of the dielectric film is constantly reduced. In turn, the voltage across the dielectric film must be drastically reduced to avoid undesired voltage breakdown effects. In order to achieve this voltage reduction, a doped area is created in the silicon substrate around the bottom of the cell capacitor. This area is commonly referred to as the "buried plate" (BP) region in the technical literature. To that end, an arsenic silicon glass (ASG) film is conformally deposited onto the chip surface to coat the trench side wall and will be subsequently used to generate the arsenic (As) atoms to heavily dope the silicon substrate in order to create these BP regions. Then, after several processing steps which are necessary to set the buried plate region depth from the top trench surface, the As atoms are out diffused from the ASG film into the silicon substrate during an anneal. A conventional buried plate region formation process specifically includes the eight basic steps recited below.

1—Etching deep trenches in a p-type silicon substrate coated with a patterned pad stack comprised of a bottom silicon oxide (SiO2) layer and a top silicon nitride (Si3N4) layer as standard.
2—Depositing a conformal ASG film onto the structure to coat deep trench side walls.
3—Filling the deep trenches with a planarizing medium such as a photoresist.
4—Removing the photoresist down to a given depth into deep trenches.
5—Removing the ASG material from unprotected areas.
6—Stripping the photoresist material remaining into deep trenches and then, depositing a conformal SiO2 layer onto the structure.
7—Out diffusing arsenic atoms from the ASG film into the silicon substrate.
8—Finally, removing SiO2 and ASG materials from deep trench side walls.

FIG. 1A schematically illustrates the starting structure 10 consisting of a p-type silicon substrate 11 with a 10 nm thick silicon oxide layer 12 and a 220 nm thick silicon nitride layer 13 formed thereon. These two layers will be referenced to hereinbelow as the SiO2/Si3N4 pad layer 12/13. As apparent in FIG. 1A, a deep trench referenced 14 has been formed in the substrate 11 by RIE etching as standard. Typically, deep trench 14 has a depth of about 7 μm and an oblong section of about 550×320 nm at the substrate surface.

Now, turning to FIG. 1B, an arsenic silicon glass (ASG) is conformally deposited by LPCVD to coat the interior trench side wall with a 45 nm thick film referenced 15. As known for those skilled in the art, As atoms contained in ASG film 15 will subsequently act as N type dopants. This step is performed in a deposition equipment such as a vertical hot dual wall SVG 7000+LPCVD reactor manufactured and sold by SVG THERMCO, Orange, Calif., USA, schematically illustrated in FIG. 3 that will be detailed later on. The reactive atmosphere includes tetraethylorthosilicate (TEOS) and triethylarsenate (TEASAT) gases.

Then, a 1.8 μm thick layer of a planarizing medium, typically a photoresist, is conformally deposited onto the structure in order to fill the deep trench 14 in excess. A photoresist such as AZ7511 manufactured by CLARIANT, Brunswick, N.J., USA, is adequate in that respect. As shown in FIG. 1C, after reflow, the photoresist layer bearing numeral 16 has a planar surface.

After photoresist reflow was performed, a given amount of the photoresist material is removed by a conventional lithographic process, so that the surface of photoresist layer 16 stands at about 1.5 μm below the structure surface. The remaining material of photoresist layer 16 exhibits a typical recessed shape at its upper surface in trench 14 as shown in FIG. 1D.

Now, the unprotected portions of the N+ doped ASG film 15 are removed by wet etching in a buffered HF bath. An overetching occurs during this wet etch step at the top annular portion of the ASG film 15 to produce the moat or dip out 17, as apparent in FIG. 1E.

Next, the photoresist material remaining at the bottom of deep trench 14 is stripped by wet etching in a Huang SP solution and a 25 nm thick SiO2 layer 18 is conformally deposited by PECVD onto the structure to coat the deep trench side wall. An AME 5000 tool commercially available from Applied Materials Inc., Santa Clara, Calif., USA is appropriate. After these two process steps have been performed, the structure 10 is shown in FIG. 1F.

The structure 10 is then heated to diffuse the As doping atoms trapped in the ASG film 15 into the adjacent portions of the silicon substrate 11 to create the buried plate region 19. At this stage of the BP region formation process, the structure 10 is shown in FIG. 1G.

After the As dopant out diffusion step is achieved by adequate annealing conditions in the SVG 7000+ reactor to reach the desired junction (or diffusion) depth of at least 0.25 μm. The ASG film 15 and the SiO2 layer 18 are removed by means of an appropriate wet etching. This last step ends the buried plate region formation process and the final structure is shown in FIG. 1H. Any attempt to create buried plate region 19 by mean of an arsenic ion implantation step would fail because the deep trench is too minute and such implantation would require an inaccessible level of implant energy.

To understand the specific buried plate region process requirements, it is necessary to consider the structure 10 at a much further stage of the chip fabrication process. FIG. 2 shows structure 10 after gate conductor stack and source/drain regions completion. At this stage, with regard to the structure depicted in FIG. 1H, the SiO2/Si3N4 pad layer 12/13 has been eliminated and the trench 14 has been filled with doped polysilicon to form the first electrode of the cell capacitor. The polysilicon fill is electrically isolated from the substrate 11 by a 30 nm thick TEOS SiO2 collar layer 21 on its upper part and a 5 nm thick reoxidized silicon nitride layer 22 on its lower part. The latter layer forms the dielectric film of the cell capacitor. Still very schematically, two ion implantation steps are performed to define first a 1000 nm thick N-well 23, then a 800 nm thick P-well region 24. The second electrode of the cell capacitor is thus formed by the buried plate region 19, the N-well region 23 being used to interconnect all the buried plate regions of the chip. Finally, after gate conductor stack 25 and source/drain regions 26 formation, an IGFET bearing numeral 27 visible in FIG. 2 is created.

It is essential to chip reliability that the top of BP region 19 is located below and preferably at about 450 nm from the P-well/N-well junction. If the top of BP region 19 extends in the P-well region, a parasitic NPN transistor is then constituted by the N type drain region 26 of IGFET 27, the P-well 24 and the N+ BP region 19 that will degrade the storage operation. If the top of BP region 19 is below the bottom of N-well region 23, the BP region 19 could not be biased via the N-well 23 any longer and undesired voltage breakdown would occur during storage operation. As a consequence, it is recommended to have the top of the BP region 19 centered in the N-well at 1250 nm+−450 nm from silicon substrate 11 surface. The best case is when the top of BP region 19 slightly overlaps the bottom of collar layer 21 as made apparent in FIG. 2. If we take into account ASG film wet etch and out diffusion steps, the targeted value for photoresist etch is 1500 nm+−250 nm which corresponds to the value indicated in FIG. 1D.

The step of partially removing the photoresist material of layer 16 is thus essential to the whole buried plate region formation process because the remaining photoresist determines the protected portions of the ASG film to remain which in turn defines the BP region during the out diffusion step.

However, Applicant's inventors have discovered that instead of improving the photoresist etch step described by reference to FIG. 1D, the same result could be obtained through the improvement of the ASG film deposition step. Surprisingly, they pointed out the determining role of two parameters: the ASG film thickness and As concentration in the ASG film and more particularly of their uniformity, trench to trench, wafer to wafer and lot to lot.

Now turning to FIG. 3, the vertical reactor referenced 30 is essentially comprised of outer and inner walls 31 and 32 affixed upon a base 33. The temperature inside the reactor is controlled by a five heating zone element 34. A boat 35 containing the wafers 36 is mounted on a pedestal 37 in the central part of the base 33. An exhaust pump 38 is connected to the interior volume of the reactor by adequate piping. Reactor 30 further includes a TEASAT bubbler system 39 and a TEOS vapor delivery system 40. The reactor has two separated bottom gas injections for the TEOS and TEASAT lines at opposite side of the base 33. The TEOS vapor delivering system and the TEASAT bubbler are manufactured by Schumacher, Carlsbad, Calif., USA, which also supplies the TEASAT precursor. The TEOS gas is produced by heating liquid TEOS in an ampule at 65° C. (supplied by OLIN HUNT, Seeward, Ill., USA). As far as TEASAT is concerned, vapor is fabricated by nitrogen bubbling in a 45° C. heated liquid TEASAT ampule (manufactured by Schumacher). The diameters of the injection lines are equal to 0.25 inch. TEOS and TEASAT precursors delivery gas lines and nitrogen bubbling line are all heated up to 80° C. to avoid gas condensation into liquid droplets before injection. For this deposition step, the process parameters are:

| | |
|---|---|
| Bubbler Temp.: | 45° C. |
| Process Temp.: | 650° C. |
| Sheet Res. (max.): | 150 Ohm/sq |
| Dep. rate: | 1.1 nm/min |
| ASG film thickness: | 45 nm |
| TEOS flow: | 20 sccm |
| TEAS/N2 flow: | 20 sccm |
| Press.: | 600 mT |
| Boat (.37 inch pitch): | 25 wafers |

This sheet resistivity of 150 Ohm/sq which is the greatest acceptable value corresponds to an As atom concentration of about 5E19 at/cm3 in the ASG film 15 . The conventional ASG film deposition process mentioned above produces ASG film side wall thickness of 45 nm (+−15% wafer to wafer, +−7% within a same wafer) and an As concentration varying between 1E21 and 2E21. As a global result, the junction depth and the As concentration in BP region 19 can be out of specifications (below the desired values of 0.25 μm and 5E19 at/cm3 respectively). Moreover, the top location of BP region 19 can be not well centered. As emphasized above, the BP region 19 top location spreads so much within the chip with the conventional process that this is dramatic for chip reliability.

More generally, according to their works they arrived to the conclusion that an adequate ASG film deposition step should meet the following criteria:

1—An excellent conformality between top trench surface and trench side wall.

2—A very good thickness uniformity.

3—A very good sheet resistance uniformity.

Moreover, this must be obtained with the maximum reproducibility trench to trench, wafer to wafer and lot to lot. A direct consequence of this uniformity improvement is a significant increase in the product wafer batch size. As a matter of fact, every variation of these two key parameters provides undesired variations of other important process parameters at subsequent steps: photoresist fill and etch, ASG film etch, and finally in the buried plate region formation. Finally, if these key parameters are not with specifications, other problems can be noticed. If ASG film thickness is too high, some part of the ASG film may be left at the bottom of the trench after stripping, then, the cell capacitance is too low and would involve a retention time problem (ONO dielectric material instead of NO). Moreover, because the increased depth of the moat 17 due to the necessary over etch, the top location of BP region 19 will be too low. On the other hand, if the As concentration is too low (not enough doping species), the BP region 19 is not well formed and the cell capacitor breakdown occurs at lower VT (threshold voltage).

SUMMARY OF THE PRESENT INVENTION

It is therefore a primary object of the present invention to provide an improved method for forming an arsenic silicon glass (ASG) film onto a silicon structure by LPCVD.

It is another object of the present invention to provide an improved method for forming a highly conformal ASG film onto a silicon structure by LPCVD with high thickness and arsenic concentration uniformity.

It is another object of the present invention to provide an improved method for forming an ASG film particularly well adapted to the buried plate region formation in deep trench cell capacitors in EDO and SDRAM memory chips.

It is another object of the present invention to provide an improved method for forming an ASG film particularly well adapted to the buried plate region formation in deep trench cell capacitors without requiring arsenic ion implantation.

It is still another object of the present invention to provide an improved method for forming an ASG film well adapted to the buried plate region formation that allows a significant reduction of manufacturing costs by in creasing the product wafer batch size.

It is still another further object of the present invention to provide an improved method for forming an ASG film well adapted to the buried plate region formation wherein the contamination level is very low.

The accomplishment of these and other related objects is achieved by the method of the present invention which aims to get rid of the drawbacks inherent to the conventional method of forming an arsenic silicon glass (ASG) film onto a silicon structure by LPCVD from TEOS and TEASAT precursors. Unfortunately, as soon as these gases are injected in the LPCVD reactor it occurs an uncontrolled interactive co-pyrolysis between them. According to the improved method of the present invention, the adjunction of an oxygen flow in the reactor makes said co-pyrolysis no longer interactive and the deposition process is perfectly under control.

Consequently, it is obtained a highly conformal ASG film which has also an excellent thickness and As concentration uniformity. Moreover the batch size can be increased (from 25 to 75 wafers). Another advantage is that O2 permits to burn impurities in gas phase, to prevent carbon (from precursors) and SiO2 flakes (from glassware coating) incorporation into the ASG film, reducing thereby the global contamination thereof. As a consequence, the ASG film that is finally obtained has a high glass purity.

The novel features believed to be characteristic of this invention are set forth in the appended claims. The invention itself, however, as well as these and other objects and advantages thereof, will be better understood by reference to the following detailed description of an illustrated preferred embodiment to be read in conjunction with the accompanying drawings.

DETAILED DESCRIPTION OF THE INVENTION

According to the conventional method described above, the ASG film deposition is obtained by reacting a mixture of TEOS (TetraEthylOrthoSilicate) and TEASAT (TriEthylArsenate) in a gaseous phase and in a LPCVD reactor. The TEOS gas is flowing into the process chamber and the TEASAT gas is carried into the reactor through N2 bubbling. Applicant's inventors have discovered that the poor thickness and As concentration uniformity of the ASG film resulted of a fast and immediate reaction between TEOS and TEASAT precursors which react together according to an uncontrollable kinetics as soon as they are injected. The TEASAT molecule takes some oxygen atoms from the TEOS molecules to form the desired arsenic oxide (As2O5) in the ASG material, but because the TEOS thermal decomposition is catalyzed by the TEASAT presence (this reaction is called "interactive co-pyrolysis"), the chemical reaction is not homogeneous all along the vertical reactor. They have remarked that the co-pyrolysis is much faster at the injection zone (bottom of the reactor) than at the exhaust zone (top of the reactor). So that the arsenic carrying reactant (TEASAT) is getting poorer and poorer as it travels across the vertical reactor, and the two key process parameters mentioned above, i.e. the ASG film thickness and As dopant concentration in the ASG film become extremely hard to control.

Figure 1A:
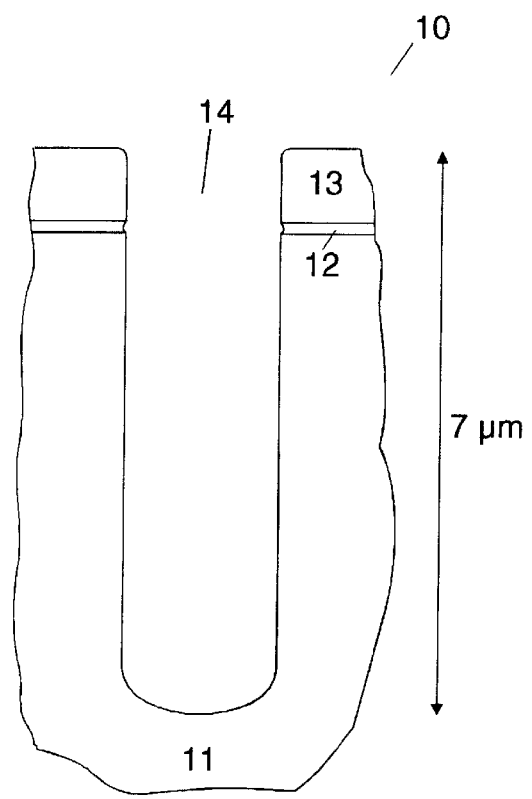
FIGS. 1A to 1H show a state-of-the-art structure consisting of a silicon substrate provided with a deep trench undergoing the essential steps of a conventional buried plate region formation process.
Figure 1B:
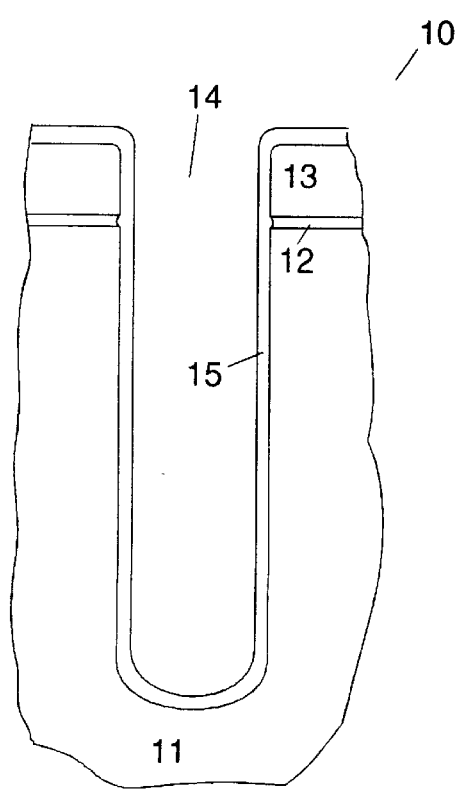
Figure 1C:
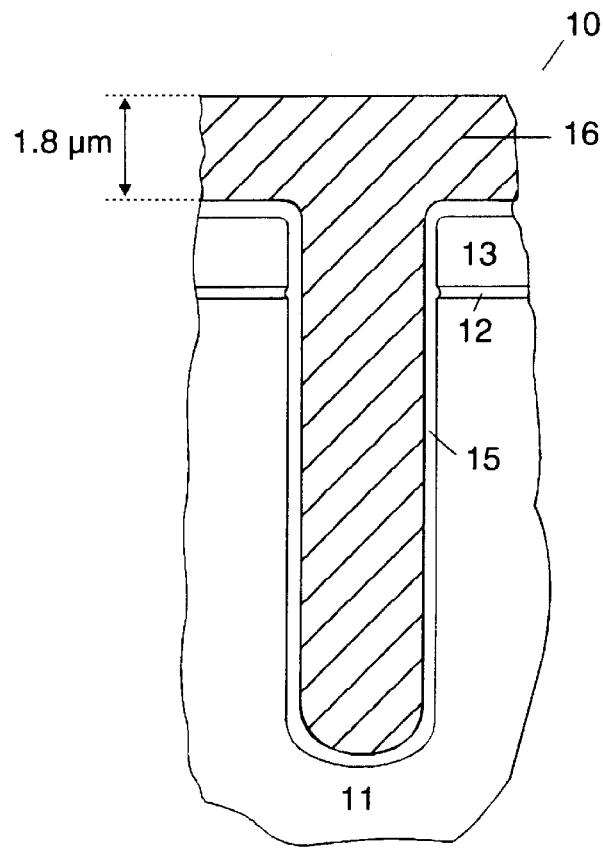
Figure 1D:
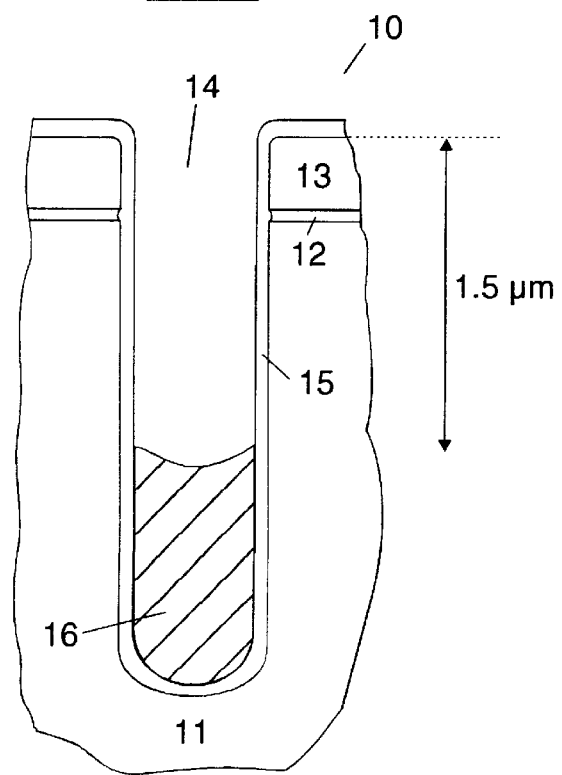
Figure 1E:
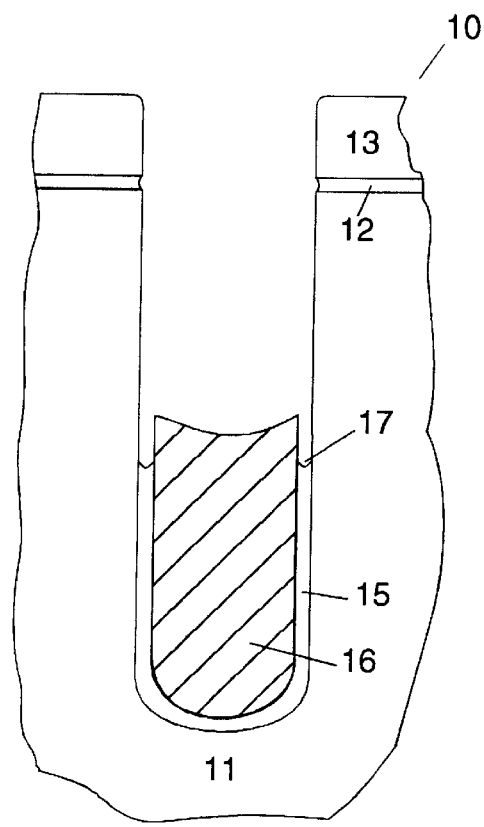
Figure 1F:
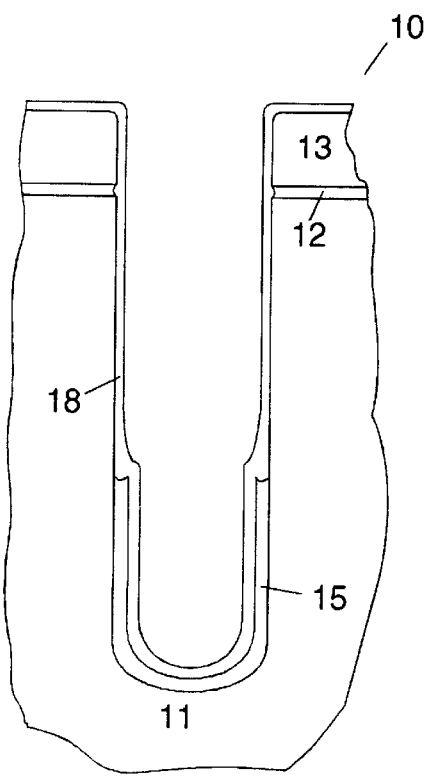
Figure 1G:
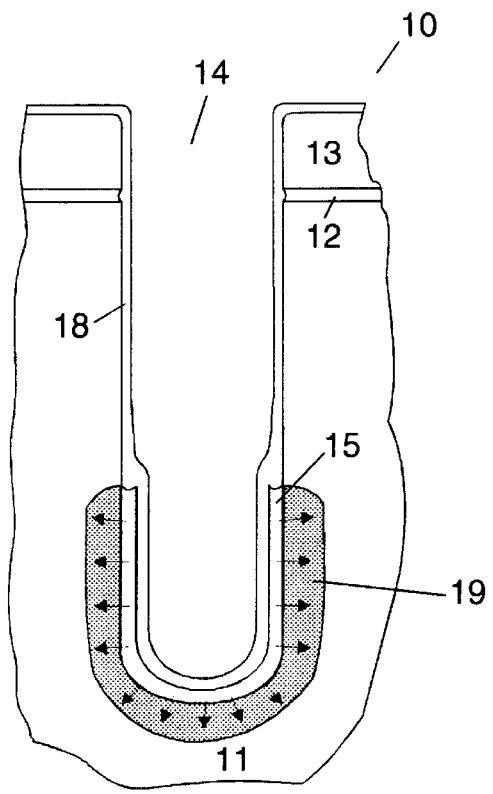
Figure 1H:
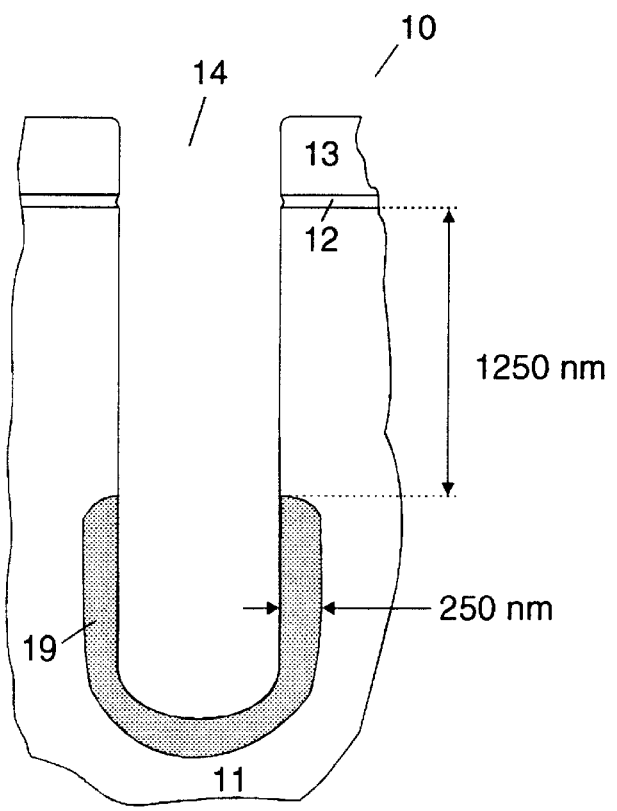
Figure 2:
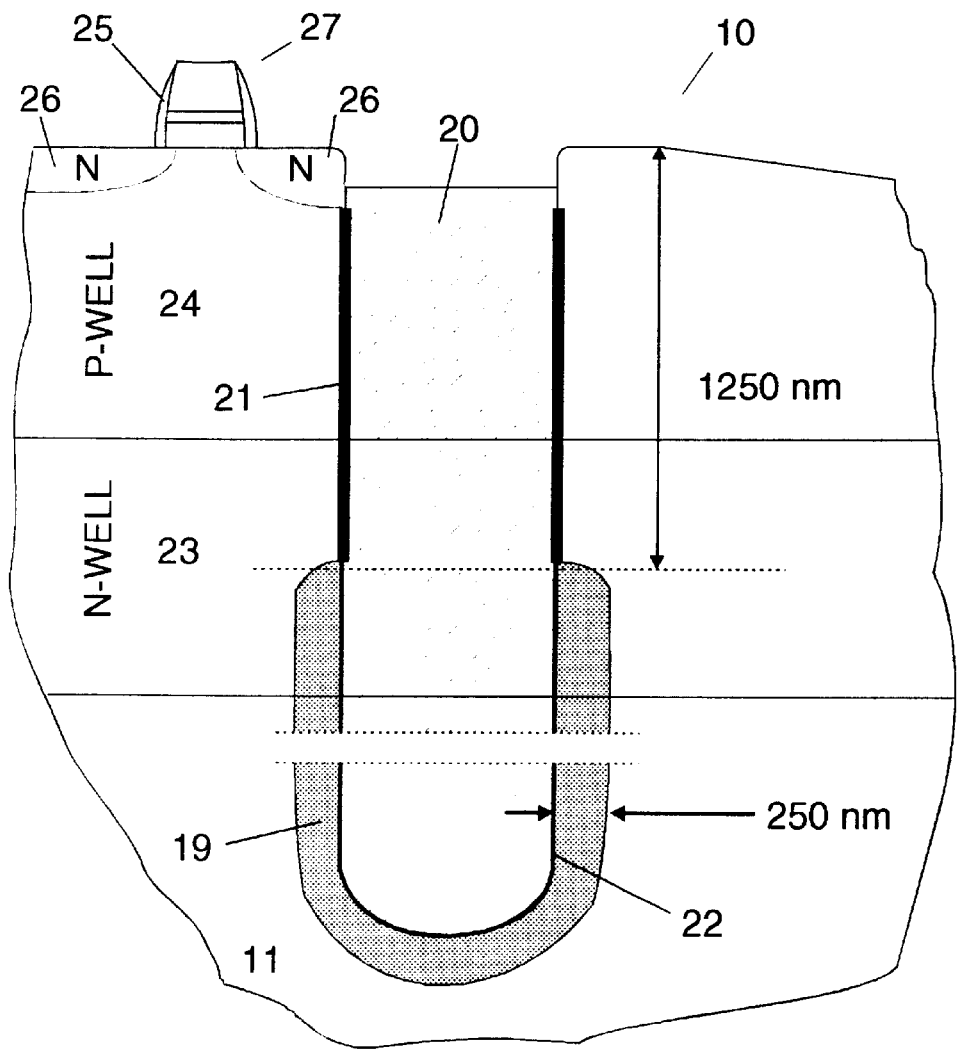
FIG. 2 shows the structure substantially at the end of the deep trench cell capacitor fabrication process after gate stack conductor and source/drain region formation to emphasize the critical aspects of the buried plate region formation process and control thereof.
Figure 3:
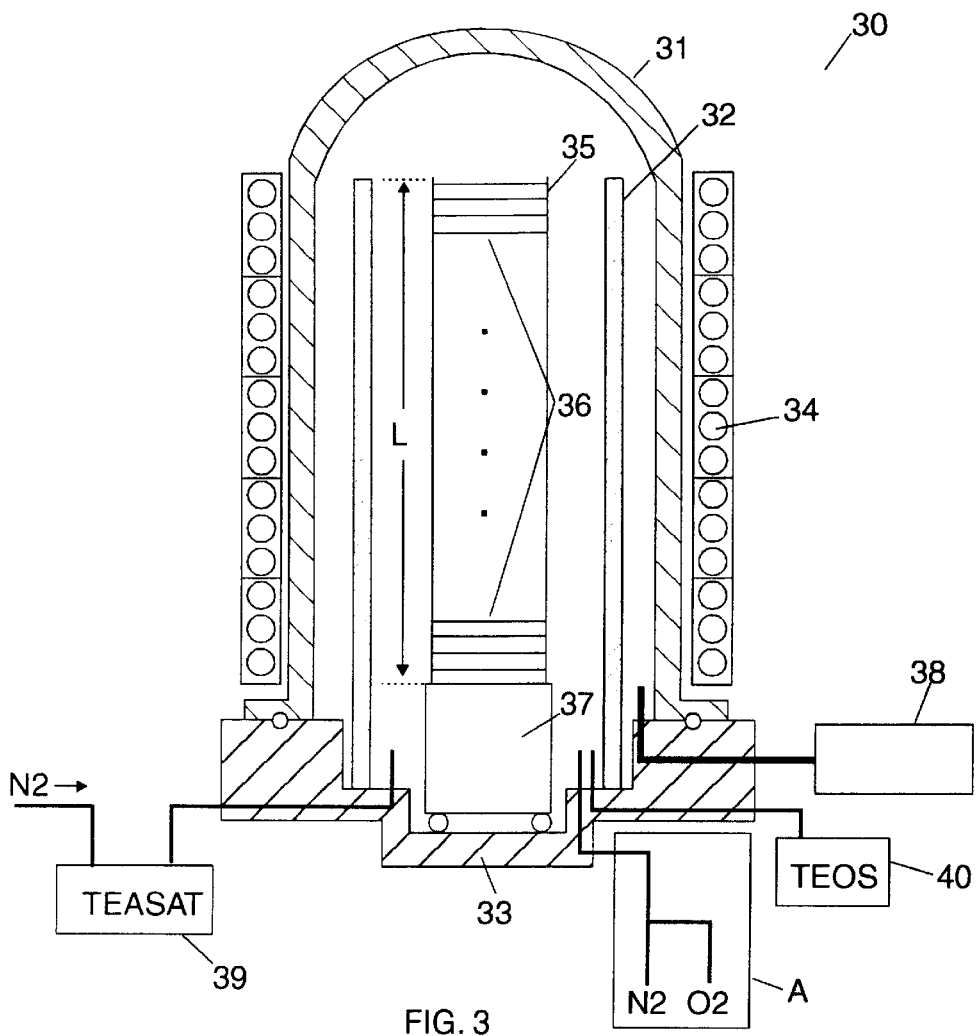
FIG. 3 schematically shows a conventional vertical hot dual wall LPCVD reactor incorporating a common N2/O2 injection line according to the method of the present invention.
Figure 4:
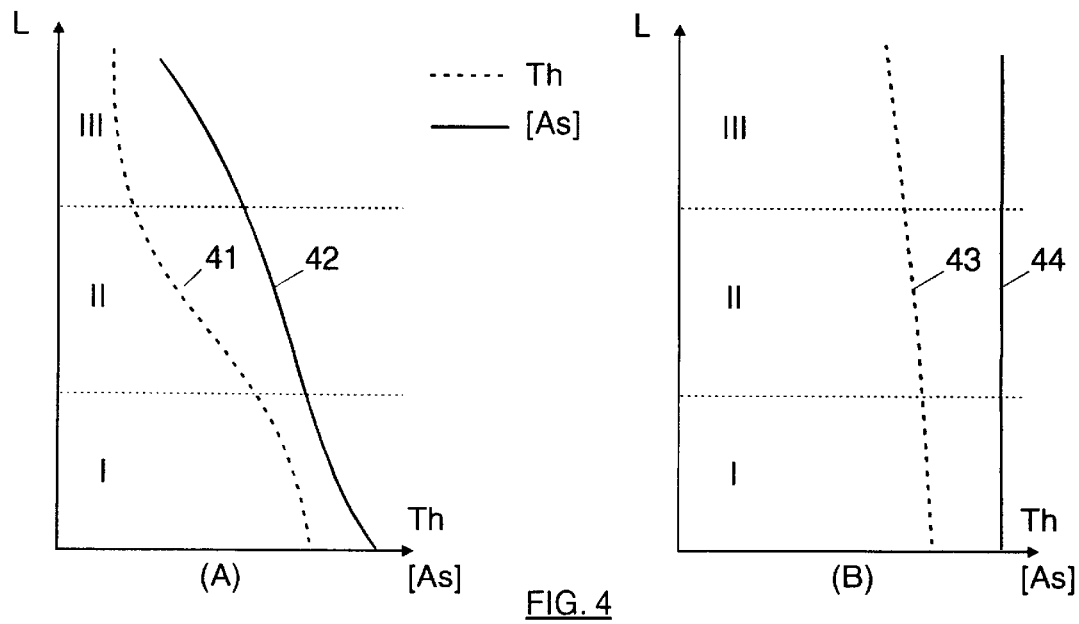
FIGS. 4(A) and 4(B) are graphs depicting the thickness and the As atom concentration variations along the LPCVD reactor with the conventional and the improved method of the present invention respectively.

FIG. 4(A) shows the variation of the thickness (curve 41) and of the As concentration (curve 42) along the vertical reactor of FIG. 3 (conventional version) in its active area represented by distance L. In the second zone II, the reaction is correctly controlled while it is not in the extreme zones I and III resulting in poor ASG film thickness uniformity wafer to wafer (zone I) and As concentration uniformity within a same wafer (zone III).

Both thickness and As concentration huge gradient across the reactor explains why it is impossible to increase the wafer batch size (using the conventional process, the batch size was of 25 wafers) and to get the desired ASG film thickness of 45 nm and sheet resistivity of about 150 ohms/sq all along the reaction zone. Moreover the poor product wafer batch size (WBS) of 25 makes only a small part of gaseous species to react inside the reactor (due to low total reactive surface) and the unreacted part condenses in the exhaust piping. That condensation into solid state form cloggs the exhaust piping. On the other hand, an incomplete reaction reduces tool performance in terms of tool downtime and foreign materials generation. As a consequence, some sorts of preventive maintenance are needed to recover the reactor into specifications.

Therefore, it was highly desired to improve the uniformity of these parameters not only within a same wafer but also wafer to wafer and lot to lot. Applicant's inventors have discovered that the addition of oxygen provides an outstanding improvement of ASG film deposition specifications without modifying the doping material properties. The ASG film deposition is still made in the SVG 7000+ vertical reactor and broadly with the same operating conditions mentioned above. The only notable exception is that O2 as a reactant and N2 as a carrier gas will be added to the TEOS and TEASAT precursors. As apparent in FIG. 3, the innovative change in the deposition system lies in box labeled A. Now, three separated bottom gas injections are used for the TEASAT, TEOS, and O2/N2 gases because one may notice that there is a common injection line for the N2 and O2 gases. The O2/N2 common injection line is heated up to 80° C. to avoid gas condensation into liquid droplets in the lower part of reactor 30. Note also that the diameter of the O2/N2 common line has been set to 0.25 inch to augment the gas velocity and the TEASAT line diameter increased to 0.5 inch.

Process parameters read as follow:

| Bubbler Temp.: | 65° C. |
|---|---|
| Process Temp.: | 650° C. |
| Sheet Res. (max.): | 150 Ohm/sq (As conc.: 2E21 at/cm3) |
| Dep. rate: | 1,1 nm/min |
| ASG film thickness: | 45 nm |
| TEOS flow: | 20 sccm |
| TEAS/N2 flow: | 30 sccm |
| O2 gas flow: | 20 sccm |
| N2 gas flow: | 20 sccm |
| Press.: | 600 mT |
| Boat (.25 inch pitch): | 75 wafers |

However, the following temperature ranges provide good results:

| O2 gas flow: | 5–30 sccm |
|---|---|
| N2 carrier flow: | 10–40 sccm |

FIG. 4(B) shows the ASG film thickness and As atoms concentration that are now obtained with the method of the present invention. In FIG. 4(B) where these profiles are illustrated by curves 43 and 44 respectively. In FIG. 4(B), it is apparent that both profiles are more flat along the totality of the reactor length L. The depletion of the TEASAT reactant does not occur anymore because the TEASAT need of oxygen is now supplied by another source and no longer by the TEOS precursor, so that the TEOS/TEASAT/O2 co-pyrolysis becomes non-interactive. The reactants have then a separate thermal decomposition as soon they are injected, leading to a more uniform ASG film deposition by bringing enough As atoms at the top of the reactor and slowing the total decomposition rate.

Different characterizations (contamination, thickness and As concentration) are carried out on p-type silicon wafers. The As dopant concentration across the LPCVD reactor is monitored by sheet resistivity measurements as standard. Generally, three silicon wafers located in quite different places across the boat at bottom, center and top are used as monitor samples. As far as sheet resistivity measurements are concerned, an intrinsic SiO2 cap layer is deposited onto the ASG film (in an AME 5000 PECVD chamber) to avoid out diffusion during the further anneal step. This drive-in anneal is carried out in a SVG VTR 7000+ anneal furnace to produce the As diffusion into the silicon substrate. Finally, both the SiO2 cap layer and the ASG film are stripped off in a BHF bath. Sheet resistivity is determined after all these last steps and is ranging from 80 (bottom monitor) to 120 (top monitor) ohms/sq whereas the Rs specification must be less than 150 ohm/sq.

When using the method of the present invention, the deposition rate still reaches 1.1 nm/min but now with a total thickness control. For instance the ASG film thickness is in the 45 nm+–3% range (wafer to wafer) and is achieved across the totality of the 75 product wafer load. Thickness uniformity within wafer is less than 2.5 % at three sigma ensuring thereby a very good layer uniformity trench to trench across the chip and is easily kept on the 75 product wafers of the batch. Film conformality is about 55% that is 5 to 7% better than with the conventional process. The arsenic concentration in the ASG film is measured with a Rigaku 3630 (manufactured by RIGAKU, Osaka, Japan). It varies from 9 at the bottom of the reactor to 6.5 As w % at its top instead of a 12 to 2 As w % range with the conventional process.

This invention not only allows to get rid of thickness and As concentration non-uniformity along the reactor but also brings foreign particles (FM) at an outstandingly low level (<20 particles per monitor wafer) and produces high glass purity (very low level of Carbon and OH radicals) probably because the chemical reaction is more complete. That yield improvement decreases the amount of a glassy solid formed with a byproducts mixture condensation which is clogging exhaust piping and at last aborting tool performance. Then, the reactor downtime is drastically reduced.

By the mean of O2 addition which makes the co-pyrolysis of TEOS and TEASAT (or other similar arsenic containing compounds such as triethoxyarsine) non-interactive, the process of the present invention is much better controlled. The quality of deposited ASG film is then improved (conformality, thickness and As concentration distribution uniformity and finally purity). The Arsenic atoms incorporated in the ASG film, vehicle of the buried plate region formation are better carried in gaseous phase across the totality of the reactor length and its concentration in the ASG film is nearly independent of the patterned wafer surface. Consequently, the present method could be applied to next product generations and the deep trench cell capacitor life could be extended. At the same time, the non-interactive copyrolysis thanks to the O2 presence improves the process step manufacturability by batch size/process speed increasing and LPCVD tool downtime lowering.

In other words, in addition to meeting the three objectives recited above, the method of the present invention meets the following advantages:

4—A very good repeatability run to run.
5—A high tool capacity (batch size increase from 25 to 75 wafers).
6—A reduced downtime.
7—A very low level of foreign particles.
8—A valuable alternative to oblique ion implantation.
9—Applicable to next generation of ICs.

What is claimed is:

1. A method of forming an arsenic silicon glass (ASG) film onto a semiconductor wafer comprising the steps of:
   a) providing a vertical hot LPCVD reactor having a processing chamber with a vertical boat containing a plurality of wafers of a lot to be processed that are disposed horizontally;
   b) providing a first gas flow into the reactor, the first gas flow containing tetraethylorthosilicate (TEOS) gas flowing from the bottom to the top of the chamber;
   c) providing a second gas flow into the reactor, the second gas flow containing triethylarsenate (TEASAT) gas flowing from the bottom to the top of the chamber;
   d) providing a third gas flow into the reactor, the third gas flow containing oxygen (O2) gas flowing from the bottom to the top of the chamber; and
   e) controlling the third gas flow separately from the first gas flow and the second gas flow,
   so that a non-interactive co-pyrolysis between TEOS and TEASAT is produced due to the oxygen in the third gas flow, thereby allowing conformal deposition of an ASG film onto the wafer with a high degree of thickness and arsenic concentration uniformity within a same wafer and from wafer to wafer of the lot.

2. The method of claim 1 wherein the reactor is of a dual wall type.

3. The method of claim 2 wherein nitrogen is used as a carrier gas to transport the oxygen as a reactant in a common injection line.

4. The method of claim 3 wherein the TEASAT gas is fed into the reactor by a pipe having a diameter of 0.5 inch, and the O2/N2 gases are fed into the reactor by a common pipe having a diameter of 0.25 inch.

5. The method of claim 1 wherein TEASAT is produced in a bubbler containing liquid TEASAT enclosed in an ampule heated at 65° C.

6. The method of claim 1 wherein the operating conditions are as follows:

| Process Temperature: | 650° C. |
|---|---|
| Deposition rate: | 1.1 nm/min |
| ASG film thickness: | 45 nm |
| TEOS flow: | 20 sccm |
| TEAS/N2 flow: | 30 sccm |
| O2 gas flow: | 20 sccm |
| N2 gas flow: | 20 sccm |
| Pressure: | 600 mT |
| Boat (.25 inch pitch): | 75 wafers. |

7. A method of forming a buried plate region in a deep trench of a silicon substrate comprising the steps of:
   a) providing a structure comprised of a silicon substrate coated by a patterned SiO2/Si3N4 pad layer to define deep trenches formed therein by etching;
   b) coating the interior walls of said deep trenches with an arsenic silicon glass (ASG) film in a vertical hot LPCVD reactor having a vertical processing chamber by a process of co-pyrolysis of tetraethylorthosilicate (TEOS) gas and triethylarsenate (TEASAT) gas, said process being non-interactive due to addition of oxygen as a reactant, said process including the steps of
      providing a first gas flow into the reactor, the first gas flow containing the TEOS gas flowing from the bottom to the top of the chamber,
      providing a second gas flow into the reactor, the second gas flow containing the TEASAT gas flowing from the bottom to the top of the chamber,
      providing a third gas flow into the reactor, the third gas flow containing the oxygen gas flowing from the bottom to the top of the chamber, and
      controlling the third gas flow separately from the first gas flow and the second gas flow;
   c) depositing a layer of a photosensitive material to fill the trenches in excess;
   d) RIE etching the photosensitive material into said deep trenches down to a desired depth to leave the photosensitive material only where the buried plate region is to be formed;
   e) removing the exposed portion of the ASG film from the walls of said deep trenches;
   f) removing the photosensitive material remaining in said deep trenches;
   g) capping the remaining ASG film with a SiO2 passivation layer;
   h) out-diffusing the arsenic atoms from the ASG film into the substrate to form said buried plate regions; and
   i) eliminating the SiO2 passivation layer and the remaining ASG film.

8. The method of claim 7 wherein the reactor is of a dual wall type.

9. The method of claim 8 wherein nitrogen is used as a carrier gas to transport the oxygen as a reactant in a common injection line.

10. The method of claim 9 wherein the TEASAT gas is fed into the reactor by a pipe having a diameter of 0.5 inch, and the O2/N2 gases are fed into the reactor by a common pipe having a diameter of 0.25 inch.

11. The method of claim 7 wherein TEASAT is produced in a bubbler containing liquid TEASAT enclosed in an ampule heated at 65° C.

12. The method of claim 7 wherein the operating conditions are as follows:

| Process Temperature: | 650° C. |
|---|---|
| Deposition rate: | 1.1 nm/min |
| ASG film thickness: | 45 nm |
| TEOS flow: | 20 sccm |
| TEAS/N2 flow: | 30 sccm |
| O2 gas flow: | 20 sccm |
| N2 gas flow: | 20 sccm. |

* * * * *